United States Patent [19]

Sahasrabudhe et al.

[11] 4,042,888
[45] Aug. 16, 1977

[54] SIGNAL AMPLIFIER APPARATUS WITH FAIL-SAFE LIMITED GAIN

[75] Inventors: Arun P. Sahasrabudhe, Monroeville; Thomas C. Matty, N. Huntingdon Township, Westmoreland County, both of Pa.

[73] Assignee: Westinghouse Electric Corporation, Pittsburgh, Pa.

[21] Appl. No.: 661,460

[22] Filed: Feb. 26, 1976

[51] Int. Cl.² ............................................. H03F 1/34
[52] U.S. Cl. ................................................. 330/109
[58] Field of Search ................... 330/21, 31, 107, 109; 328/167

[56] References Cited

U.S. PATENT DOCUMENTS 3,408,507   10/1968   Martin .............................. 307/202 X
3,838,353   9/1974    Matty ................................. 330/107

OTHER PUBLICATIONS

"Active Filters with Gain", *Electronic Engineering*, Feb. 1972, pp. 54, 56.

*Primary Examiner*—James B. Mullins
*Attorney, Agent, or Firm*—R. G. Brodahl

[57] ABSTRACT

A signal amplifier and clipper apparatus is disclosed including two four terminal capacitors and an operational amplifier to obtain fail-safe voltage gain which will not increase due to the failure of any element of the apparatus. A signal clipping operation is provided by the saturation of the operational amplifier output at the supply voltages, such that a maximum output signal level is provided by a fail-safe attenuator operation that will not decrease.

6 Claims, 5 Drawing Figures

SIGNAL AMPLIFIER APPARATUS WITH FAIL-SAFE LIMITED GAIN

CROSS-REFERENCE TO RELATED APPLICATIONS

Reference is made to a copending patent application Ser. No. 568,226, filed Apr. 15, 1975 and entitled "Fail-Safe Speed Command Decoder" by A. P. Sahasrabudhe and a copending patent application Ser. No. 568,225, filed Apr. 15, 1975, now issued as U.S. Pat. No. 3,966,148 and entitled "Signal Threshold Responsive Apparatus" by A. P. Sahasrabudhe, which applications are assigned to the assignee of the present invention.

BACKGROUND OF THE INVENTION

In a train vehicle control and occupancy detection system such as disclosed in U.S. Pat. No. Re. 27,472 of G. M. Thorne-Booth, audio frequency signals are operative with predetermined track signal block circuits for the purpose of sensing the occupancy by a train vehicle of a signal block circuit and are operative for fail-safe speed control of that train vehicle. The track rails are divided into signal block circuits of known length by low impedance connections placed across the track rails at the ends of each signal block. A signal transmitter is provided at one end of each signal block to supply a desired speed control signal to that signal block and a first signal receiver is provided at the opposite end of the signal block to determine vehicle occupancy and a second signal receiver is carried by the train vehicle to determine the operating speed of the vehicle in that signal block. For this purpose comma free binary coded vehicle control signals and vehicle speed command information is transmitted on multiple message frequencies, such as 5 kilohertz and 10 kilohertz which represent binary message units 1 and 0. Digital frequency modulation, frequency shift key modulation or phase shift key modulation can be employed to carry binary coded speed command information to the train vehicle. Before the information transmitted on the message frequencies can be utilized it must be decoded according to the particular modulation used by the control system. This decoding must be performed in a manner such that extraneous signals which are received will not cause the vehicle to operate in an unsafe manner.

There is disclosed a fail-safe amplifier apparatus having a predetermined gain in U.S. Pat. No. 3,838,353 of T. C. Matty, wherein the feedback impedance included a four terminal capacitor to compensate for the failure mode of the amplifier in which the open circuit condition of the feedback element occurs or a short circuit condition occurs.

SUMMARY OF THE INVENTION

A signal amplifier apparatus is provided including an operational amplifier coupled with two four terminal capacitors to provide fail-safe voltage gain that cannot increase due to any failure of that apparatus. A signal clipping operation is provided by the saturation of the operational amplifier output. A fail-safe attenuator is operative with the output of said amplifier to assure a maximum output signal level in relation to a resistor and capacitor circuit provided in the output of the operational amplifier to determine the maximum output signal in accordance with the ratio of the impedance of the resistor to the impedance of the capacitor.

DESCRIPTION OF THE PREFERRED EMBODIMENT

Figure 1:
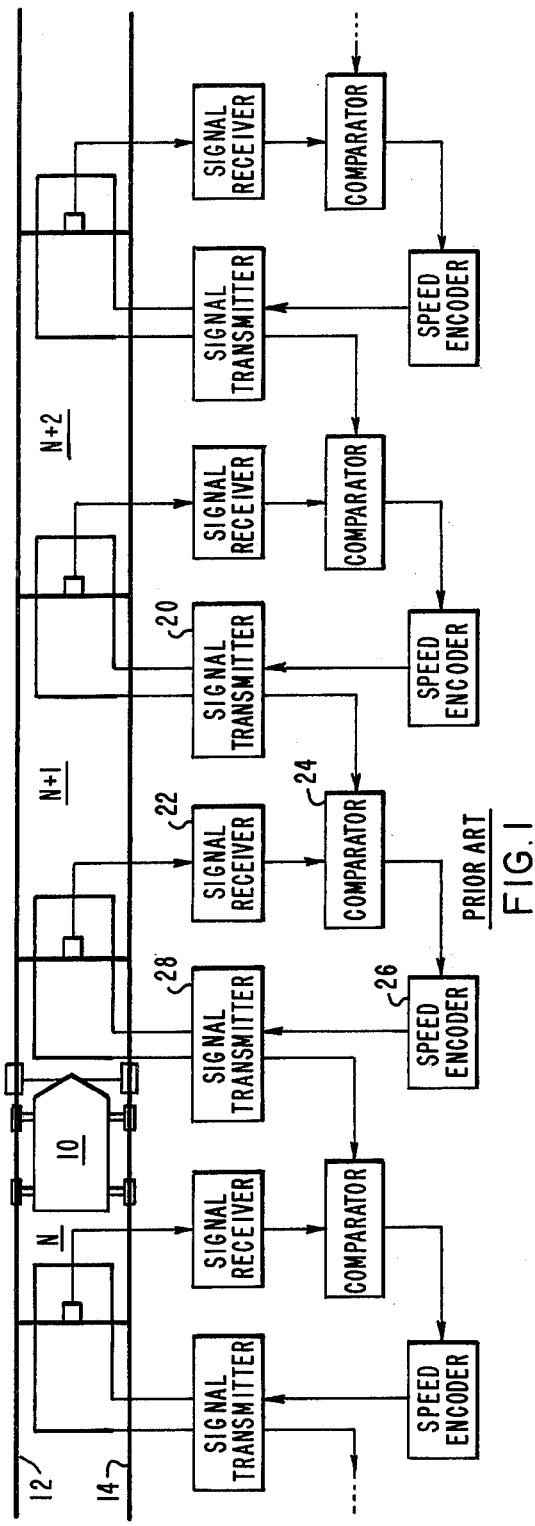
In FIG. 1 there is shown a well known train vehicle control system including speed coded signal energized signal block circuits.

In FIG. 1 there is shown a well known train vehicle control system including a vehicle 10 operative to move along track rails 12 and 14. Track signal blocks N, N+1 and N+2 are each operative with a speed coded signal transmitter such as transmitter 20 operative with signal block N+1, and a signal receiver, such as receiver 22 operative with signal block N+1. This automated train control system is disclosed in a published article in the Westinghouse Engineer for September 1972 at pages 145 to 151. The desired speed coded command signal for the signal block N+1 is supplied by the signal transmitter 20 and this signal is received by the signal receiver 22 when the vehicle 10 is not present within the signal block N+1. When the train vehicle 10 is present within the signal block N+1, the receiver 22 does not receive the speed command signal provided by the transmitter 20 since the train vehicle 10 provides a low impedance electrical short circuit between the track rails 12 and 14. A comparator 24 compares the signal provided by transmitter 20 with the signal sensed by receiver 22 for determining the occupancy of signal block N+1 by the train vehicle 10, and when the receiver 22 does not receive the speed command signal the comparator 24 indicates a vehicle occupancy condition to the speed encoder 26 operative with the signal transmitter 28 for the next previous signal block N. In this way a subsequent train vehicle would be restricted in speed and operation within the next previous signal block N in relation to avoiding a conflict with the train vehicle present within the signal block N+1.

Figure 2:
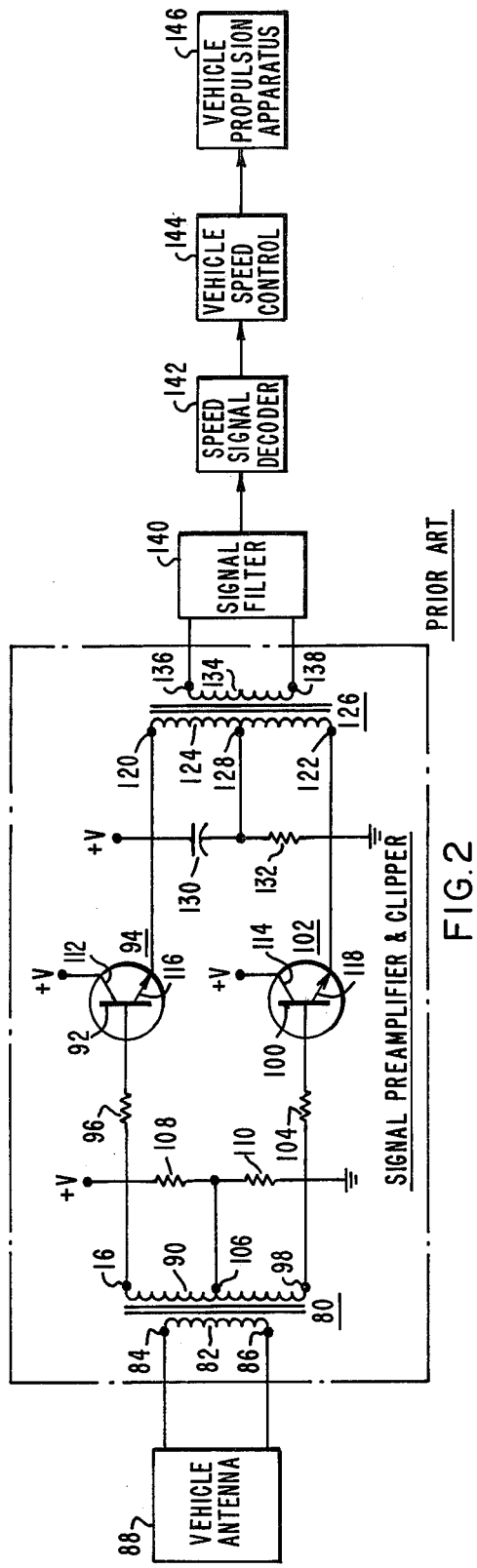
In FIG. 2 there is shown a well known vehicle carried speed signal receiver and vehicle control apparatus.

In FIG. 2 there is shown a well known vehicle carried speed signal receiver and vehicle control apparatus including a fail-safe limited gain amplifier having an input transformer 80 with a primary winding 82 operative with terminals 84 and 86 connected to a vehicle input signal responsive antenna 88. The secondary winding 90 of the transformer 80 includes a terminal 16 which is connected to the base electrode 92 of an amplifier such as an NPN transistor 94 by way of a high impedance resistor 96. A second terminal 98 of the secondary winding 90 is connected to the base electrode 100 of an amplifier such as an NPN transistor 102 by way of a high impedance resistor 104. A center tap 106 of the secondary winding 90 is connected to a source of operating potential +V through resistor 108 and a circuit ground through resistor 110. The resistors 108 and 110 form a voltage divider network which functions to bias the transistors 94 and 102 with the transistors remaining conductive in the absence of an input signal. The collector electrodes 112 and 114 of the transistors 94 and 102, respectively are connected to a source of operating potential +V. The output emitter electrodes 116 and 118 of the transistors 94 and 102, respectively are connected to first and second terminals 120 and 122 of a primary winding 124 of an output transformer 126. A center tap 128 on the primary winding 124 is connected to the source of +V by way of capacitor 130 and to circuit ground by way of resistor 132. The capacitor 130 has a low impedance with respect to frequencies in the frequency band of interest such as the frequency of the input signals received by the vehicle antenna 88. Accordingly the capacitor 130 acts as a short to such signals and essentially all of the signals passed by the respective transistors is dropped across the primary winding 124. The resistor 132 functions as a current limiting resistor to help prevent the burning out of the transistors. A secondary winding 134 of the transformer 126 has terminals 136 and 138 connected to a filter 140 which in turn is connected to a signal utilization device such as a speed decoder 142, a vehicle speed control 144 and the vehicle propulsion apparatus of a train vehicle 146.

The transistors 94 and 102 function as amplifiers which have an amplitude limited by the voltage of the source +V such that the transistors are each connected in an emitter follower configuration which results in essentially unity gain with respect to input signals applied to their respective input electrodes, as long as the input signals do not exceed a value of +V, since the signal developed at the respective emitter electrodes can go no higher than the source voltage +V. The resistors 96 and 104 each have a very, very high impedance for example 100 to 1 with respect to the impedance of the output transformer 126. The reason for using high impedance resistors in the input circuits of the respective amplifiers formed by the transistors is to compensate for possible short circuiting of the respective transistors. If the amplifier is chosen to function as the unity gain amplifier the turns ratio of the input transformer 80 would be 1 to N whereas the turns ratio of the output transformer 126 would be N to 1. The signal amplifier shown in FIG. 2 is described in greater detail in a patent application Ser. No. 468,707 filed May 10, 1974 and now abandoned by T. C. Matty and entitled "A Fail-Safe Limited Gain Amplifier".

Figure 3:
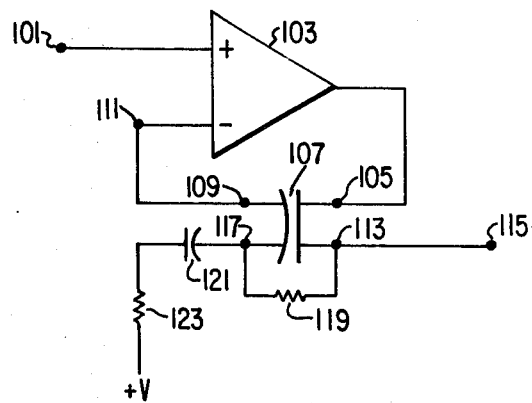
In FIG. 3 there is shown a well known operational amplifier apparatus having a four terminal capacitor included in the feedback path.

In FIG. 3 there is shown a well known operational amplifier apparatus having a four terminal capacitor included in the feedback path which has a fail-safe predetermined gain. There is shown a circuit input terminal 101 connected to a first input of an amplifier 103 which has its output connected to a first input terminal 105 of a four terminal capacitor, 107. A second terminal 109 of the capacitor is connected to a second input 111 of the amplifier 103. A third terminal 113 of the capacitor 107 is connected to a circuit output 115 and to the fourth terminal 117 of the capacitor 107 by way of a DC bias resistor 119. The terminal 117 of the capacitor 107 is connected to a source of operating potential +V through a series connection of a capacitor 121 and a resistor 123. The operational amplifier apparatus shown in FIG. 3 is described in greater detail in U.S. Pat. No. 3,838,353 of T. C. Matty.

Figure 4:
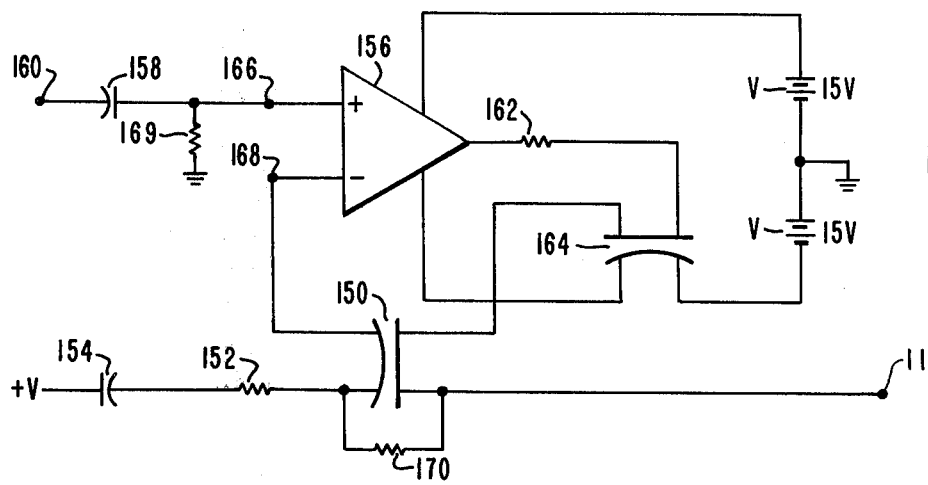
In FIG. 4 there is shown a first embodiment of the present fail-safe signal amplifier and clipper apparatus; and In FIG. 5 there is shown a second embodiment of the present fail-safe signal amplifier and clipper apparatus.

In FIG. 4 there is shown a first embodiment of the present signal amplifier and clipper apparatus operative for any input signal a circuit output 115 level to provide an output signal having no more than a predetermined maximum value and with the amplifier having no more than a predetermined maximum gain characteristic. A four terminal capacitor 150 is used as a negative feedback impedance. Alternating current voltage gain is determined by the ratio of the impedance of capacitor 150 to the impedance of the series combination of resistor 152 and capacitor 154. A fail-safe gain limit is established upon the disconnection of any lead connected to capacitor 150 which either eliminates the gain of the amplifier or removes the bias or output drive condition. A short circuit through the capacitor 154 would drive the operational amplifier 156 into a non-operational mode because the capacitor 154 is connected to either a positive or negative voltage power supply. The capacitor 158 provides direct current isolation between the input signal source connected to terminal 160 and the illustrated amplifier and clipper apparatus. The input signal source can be referenced to either +V or −V supply such that a short circuit of capacitor 158 would drive the operational amplifier 156 close to a non-operating saturated mode and reduce the alternating current signal gain of the apparatus.

When the input signal applied to terminal 160 is enough to saturate the output of the operational amplifier 156, the output signal swing of that amplifier would be at the most twice the power supply voltage V. The resistor 162 and the capacitor 164 would then determine the output signal maximum swing since the impedance of capacitor 150 is much greater than the impedance of capacitor 164. The capacitor 164 is a four terminal device and the −V supply is connected to the operational amplifier 156 through two of the leads of the capacitor 164. Therefore an open circuit condition of any of the leads of capacitor 164 would result in either a reduction of the alternating current signal gain or the absence of the output drive. A short circuit of capacitor 164 would short the output to the −V supply.

The following listing of component values is illustrative of an actually constructed and operated embodiment of the present invention:

Capacitor 150: 0.0047 F
Resistor 152: 348 ohms
Capacitor 154: 0.033 F
Amplifier 156: Motorola MC 1556
Capacitor 158: 0.1 F
Resistor 162: 10 K ohms
Capacitor 164: 0.1 F
Resistor 169: 100 K ohms
Resistor 170: 100 K ohms
V: 15 volts In relation to the component values as provided above, should be input 166 of the operational amplifier 156 become short circuited to the input 168, the resulting signal gain of the signal amplifier apparatus shown in FIG. 4 will be reduced. It should be noted that, if desired for some reason, other suitable component values can be selected by persons skilled in this art such that the output signal going into the signal filter is always limited in a fail-safe manner. As the vehicle moves along the track, the vehicle antenna will at some times supply a signal amplitude which can become substantially larger than at other times. A minimum sensitivity for the present signal amplifier apparatus must be maintained and is determined by the threshold apparatus, with the maximum output signal level being limited to avoid unsafe decoding because of ringing effects. The power supply is regulated and selected in relation to known amplifier characteristics and known input signal magnitude variation such that the amplifier output saturates before the subsequent bandpass filter experiences objectionable ringing effects.

At the lowest frequency of interest the impedance of resistor 162 can be chosen to be less than the impedance of capacitor 150. The capacitor 164 can then be chosen to provide the desired output signal clipping level such that if the non-inverting input 166 of the operational amplifier 156 short circuits to the inverting input 168, the output signal clipping level would be reduced although such a short circuit would also drop the alternating current signal gain.

For the apparatus shown in FIG. 4 the alternating current signal gain is determined by the relationship:

$$AC \text{ Voltage Gain} \simeq |XC150|/|R152 + XC154| \quad (1)$$

where the resistance $$R170 >> |XC150| \quad (2)$$

The maximum output signal crippling level is determined by the relationship:

$$\text{Output clipping level} = (|XC164|/|R162 + XC164|) \; 2V \text{ volts} \quad (3)$$

The output signal clipping level is a decreasing function of frequency since the resistor 162 and capacitor 164 form a frequency dependent attenuator.

Figure 5:
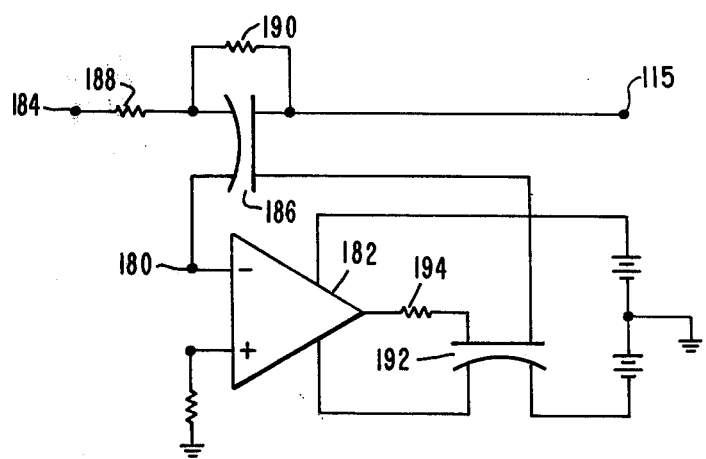

In FIG. 5 there is shown a second embodiment of the signal amplifier and clipper apparatus of the present invention using the inverting input 180 of the operational amplifier 182 for the application of the input signal through terminal 184. The alternating current signal gain is a decreasing function of frequency whereas it can be a constant value over a frequency-band in the embodiment shown in FIG. 4. For the apparatus shown in FIG. 5 the alternating current signal gain is determined by the relationship:

$$AC \text{ Voltage Gain} \simeq |XC186|/R188 \quad (4)$$

where the resistance $$R190 >> |XC186| \quad (5)$$

The maximum output signal clipping level is determined by the relationship:

$$\text{Maximum Output clipping level} \simeq (|XC192|/|R194 + XC192|) \; 2V \text{ volts} \quad (6)$$

The output signal clipping level and the alternating current signal gain are both decreasing functions of frequency.

The track current information sensed by the vehicle carried antenna and signal receiver of a transit vehicle moving through a track circuit signal block increases in amplitude as the vehicle wheels shunt the rails within a given signal block and approach the track transmitter because of the decreasing impedance of the track circuit. Accordingly, the output voltage provided by the signal input amplifier on the vehicle also increases in amplitude. If the output amplitude becomes too high, the associated tuned filter may experience undesired ringing to result in an unsafe and incorrect information signal being provided to the vehicle propulsion control equipment. If the information signal is a vehicle speed command, the ringing could cause the vehicle to travel at a higher rate of speed than desired to result in the derailment of the vehicle with attendant damage to the vehicle in injury or loss of life to passengers on-board the vehicle. With a square-wave modulated speed command signal operative with a narrow bandpass filter more than one peak output signal can occur since the output of the filter takes time to respond such that an erroneous speed command decoding operation can result. It is desired to restrict the input signal amplitude going into the bandpass filter for this reason.

As the vehicle moves within a signal block in a direction from the track receiver toward the signal transmitter, a wide variation occurs in the track signal strength sensed by the vehicle antenna, and if the maximum signal strength sensed by the subsequent bandpass filters is not limited in accordance with the present invention, there can result unsafe signal decoding problems. For this purpose, the maximum output signal from the amplifier 156 of FIG. 4 is established by selecting the power supply voltage in relation to the known operational characteristic of that amplifier 156.

We claim as our invention:

1. A linear signal amplifier apparatus having a limited gain characteristic in response to an analog input signal and in relation to a provided output signal, the combination comprising:
   amplifier means having first and second inputs and an output, with said analog input signal being applied to said first input,
   feedback means connected between said output and said second input and including a first capacitor having four terminals, with said feedback means providing a predetermined alternating current voltage gain, and
   signal attenuation means including a second capacitor connected between said output and said first capacitor to establish a predetermined maximum level of said output signal as a function of the frequency of said input signal.

2. The signal amplifier apparatus of claim 1, including voltage supply means providing a voltage selected to be operative with the known operational characteristic of said amplifier means for saturating said output to determine said maximum level of the output signal.

3. The signal amplifier apparatus of claim 1, including voltage supply means having a second capacitor and connected to said first capacitor, with said first capacitor having a first impedance and with said second capacitor having a second impedance such that a predetermined relationship between the first impedance and the second impedance is provided to determine said gain characteristic.

4. A signal amplifier apparatus having a limited gain characteristic in response to an input signal and in relation to a provided output signal, the combination comprising:
   amplifier means having first and second inputs and an output, with said input signal being applied to said first input,
   feedback means connected between said output and said second input and including a first four terminal capacitor, and
   signal attentuation means connected between said output and said four terminal capacitor to establish a predetermined maximum level of said output signal, with said signal attenuation means including a second four terminal capacitor having a predetermined impedance characteristic for establishing said maximum level of said output signal.

5. A signal amplifier apparatus having a limited gain characteristic in response to an input signal and in relation to a provided output signal, the combination comprising:
   amplifier means having first and second inputs and an output, with said input signal being applied to said first input,
   feedback means connected between said output and said second input and including a first four terminal capacitor, and
   signal attenuation means connected between said output and said four terminal capacitor to establish a predetermined maximum level of said output signal, with said signal attenuation means including a second four terminal capacitor having an impedance less than the impedance of said first four terminal capacitor.

6. A signal amplifier apparatus having a limited gain characteristic in response to an input signal and in relation to a provided output signal, the combination comprising:
   amplifier means having first and second inputs and an output, with said input signal being applied to said first input,
   feedback means connected between said output and said second input and including a first four terminal capacitor, and
   signal attenuation means connected between said output and said four terminal capacitor to establish a predetermined maximum level of said output signal, with said amplifier means being an operational amplifier, and with said signal attenuation means including a second four terminal capacitor operative with said first four terminal capacitor such that a failsafe voltage gain is provided that will not increase due to any failure of the signal amplifier apparatus.

* * * * *